United States Patent
Kim

(10) Patent No.: US 9,929,330 B2
(45) Date of Patent: Mar. 27, 2018

(54) LIGHT EMITTING DIODE PACKAGE

(71) Applicant: Seoul Semiconductor Co., Ltd., Ansan-si (KR)

(72) Inventor: Bang Hyun Kim, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 0 days.

(21) Appl. No.: 15/276,545

(22) Filed: Sep. 26, 2016

(65) Prior Publication Data

US 2017/0012190 A1    Jan. 12, 2017

Related U.S. Application Data

(63) Continuation of application No. 14/980,047, filed on Dec. 28, 2015, now Pat. No. 9,455,388, which is a
(Continued)

(30) Foreign Application Priority Data

May 24, 2010 (KR) .................. 10-2010-0048117

(51) Int. Cl.
    *H01L 33/64*     (2010.01)
    *H01L 33/48*     (2010.01)
(Continued)

(52) U.S. Cl.
    CPC ........ *H01L 33/642* (2013.01); *H01L 25/0753* (2013.01); *H01L 25/167* (2013.01); *H01L 27/0248* (2013.01); *H01L 27/15* (2013.01); *H01L 29/866* (2013.01); *H01L 33/483* (2013.01); *H01L 33/502* (2013.01);
(Continued)

(58) Field of Classification Search
CPC ... H01L 33/642; H01L 33/647; H01L 33/483; H01L 33/62

See application file for complete search history.

(56) References Cited

U.S. PATENT DOCUMENTS

2010/0181887 A1    7/2010    Baek et al.
2010/0270571 A1* 10/2010    Seo .................. H01L 33/486
                                                             257/98

FOREIGN PATENT DOCUMENTS

JP     2005-353914     12/2005
JP     2008-098600     4/2008
(Continued)

OTHER PUBLICATIONS

Non Final Office Action dated Oct. 24, 2014, in U.S. Appl. No. 14/330,518.
(Continued)

*Primary Examiner* — Douglas Menz
(74) *Attorney, Agent, or Firm* — H.C. Park & Associates, PLC

(57) ABSTRACT

A light emitting diode (LED) package includes an LED chip, a first lead frame and a second lead frame electrically connected to the LED chip and separated by a space, and a housing disposed on the first lead frame and the second lead frame. The housing includes an external housing surrounding a cavity, the cavity exposing a first portion of the first lead frame and a first portion of the second lead frame, and an internal housing disposed in the space, the internal housing covering a top portion of the first lead frame and a top portion of the second lead frame.

14 Claims, 4 Drawing Sheets

Related U.S. Application Data continuation of application No. 14/739,733, filed on Jun. 15, 2015, now Pat. No. 9,224,935, which is a continuation of application No. 14/330,518, filed on Jul. 14, 2014, now Pat. No. 9,059,386, which is a continuation of application No. 13/113,662, filed on May 23, 2011, now Pat. No. 8,796,710.

(51) Int. Cl.
- *H01L 27/15* (2006.01)
- *H01L 25/075* (2006.01)
- *H01L 25/16* (2006.01)
- *H01L 33/62* (2010.01)
- *H01L 27/02* (2006.01)
- *H01L 29/866* (2006.01)
- *H01L 33/50* (2010.01)
- *H01L 33/56* (2010.01)

(52) U.S. Cl.
CPC .............. *H01L 33/56* (2013.01); *H01L 33/62* (2013.01); *H01L 33/647* (2013.01); *H01L 33/486* (2013.01); *H01L 2224/48091* (2013.01); *H01L 2224/48247* (2013.01); *H01L 2933/0033* (2013.01)

(56) References Cited

FOREIGN PATENT DOCUMENTS

| | | |
|---|---|---|
| JP | 2008-251938 | 10/2008 |
| JP | 2009-076684 | 4/2009 |
| KR | 20090057755 * | 6/2009 |
| KR | 10-2010-0003332 | 1/2010 |
| KR | 10-2010-0027582 | 3/2010 |
| WO | 2009-072757 | 6/2009 |

OTHER PUBLICATIONS

Notice of Allowance dated Feb. 17, 2015, in U.S. Appl. No. 14/330,518.
Non Final Office Action dated Jan. 17, 2013, in U.S. Appl. No. 13/113,662.
Final Office Action dated Apr. 25, 2013, in U.S. Appl. No. 13/113,662.
Non Final Office Action dated Sep. 11, 2013, in U.S. Appl. No. 13/113,662.
Final Office Action dated Dec. 23, 2013, in U.S. Appl. No. 13/113,662.
Notice of Allowance dated Apr. 2, 2014, in U.S. Appl. No. 13/113,662.
Non Final Office Action dated Feb. 16, 2016, in U.S. Appl. No. 14/980,047.
Notice of Allowance dated May 31, 2016, in U.S. Appl. No. 14/930,047.
Notice of Allowance dated Aug. 27, 2015, in U.S. Appl. No. 14/739,733.

* cited by examiner

[FIG 4]
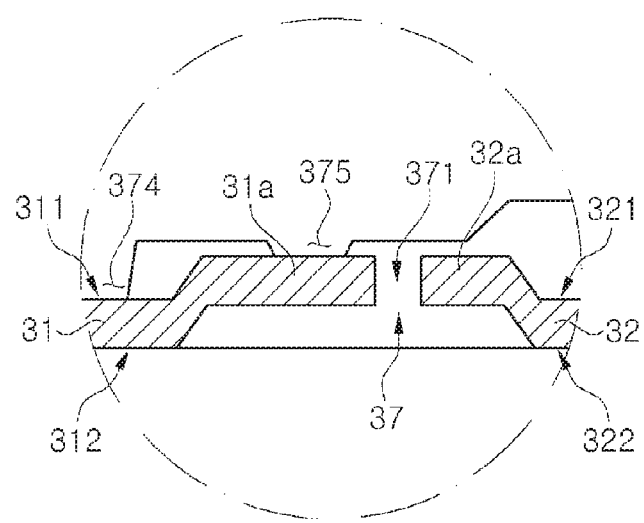

LIGHT EMITTING DIODE PACKAGE

CROSS-REFERENCE TO RELATED APPLICATIONS

This application is a Continuation of U.S. patent application Ser. No. 14/980,047, filed on Dec. 28, 2015, which is a Continuation of U.S. patent application Ser. No. 14/739,733, filed on Jun. 15, 2015, now issued as U.S. Pat. No. 9,224,935, which is a Continuation of U.S. patent application Ser. No. 14/330,518, filed on Jul. 14, 2014, now issued as U.S. Pat. No. 9,059,386, which is a Continuation of U.S. patent application Ser. No. 13/113,662, filed on May 23, 2011, now issued as U.S. Pat. No. 8,796,710, and claims priority from and the benefit of Korean Patent Application No. 10-2010-0048117, filed on May 24, 2010, all of which are hereby incorporated by reference for all purposes as if fully set forth herein.

BACKGROUND OF THE INVENTION

Field of the Invention

Exemplary embodiments of the present invention relate to a light emitting diode (LED) package and, more particularly, to an LED package which includes a housing configured to surround uplift portions formed on lead frames electrically connected to an LED chip. The LED package is to increase a heat dissipation area while increasing physical strength between the lead frames and preventing moisture absorption.

Discussion of the Background

A light emitting diode (LED) is a semiconductor device that emits light through recombination of holes and electrons in a P-N junction between a P-type semiconductor and an N-type semiconductor. Such an LED may be manufactured as a package structure having an LED chip mounted therein.

A conventional LED package 1 includes first and second lead frames 11, 12 having a direct type heat dissipation structure. As shown in FIG. 1(a), one of the first and second lead frames 11, 12 separated from each other, for example the first lead frame 11, is formed with a hole-cup 111 by half-etching.

A housing 13 is formed to support the first and second lead frames 11, 12, and an LED chip 14 is mounted on the bottom of the hole-cup 111. As shown in FIG. 1(b), the housing 13 includes the hole-cup 111 and a cavity 131 which exposes portions of the first and second lead frames 11, 12. The housing 13 may be formed by, for example, polyphthalamide (PPA) injection or epoxy molding.

The LED chip 14 mounted in the hole-cup 111 is electrically connected to the second lead frame 12 via a bonding wire W. The hole-cup 111 is filled with a light-transmitting resin 16 containing at least one phosphor, and color uniformity of light emitted from the LED chip 14 can be enhanced by the phosphor in the hole-cup 111. An encapsulation material (not shown) may be disposed in the cavity 131 of the housing 13 to protect the LED chip 14 mounted in the hole-cup 111.

When electric power is applied to the lead frames 11, 12 of the LED package 1 from an external power source, the LED chip 14 is driven to emit light to the outside through the encapsulation material. Here, on a lower surface of the LED package shown in FIG. 1(c), the first lead frame 11 having the LED chip 14 mounted thereon and the second lead frame 12 are exposed outside, and may thereby enhance heat dissipation efficiency from the LED chip 14.

However, although the LED package 1 shown in FIGS. 1(a)-1(c) may have high heat dissipation efficiency, a portion dividing the first and second lead frames 11, 12 may have low physical strength and may be vulnerable to moisture, and the hole-cup 111 formed by half-etching may be non-uniform, thereby making it difficult to maintain uniformity of light generated from the LED chip 14. Further, when the hole-cup 111 is formed by etching, manufacturing costs of the package may increase, thereby limiting mass production.

A conventional LED package 2 developed to solve the problems of such a conventional LED package 1 having low physical strength and vulnerability to moisture includes first and second lead frames 21, 22 as shown in FIG. 2(a). Specifically, the first lead frame 21 includes a first horizontal section 21a, a protrusion 21b bent from the horizontal section 21a and protruding to a predetermined distance from the first horizontal section 21a, and a second horizontal section 21c bent and extending from the protrusion 21b. Further, the second lead frame 22 includes a third horizontal section 22a facing the first horizontal section 21a, a depression 22b bent from the third horizontal section 22a and depressed into the second lead frame 22, and a fourth horizontal section 22c bent from the depression 22b and facing the second horizontal section 21c. The protrusion 21b of the first lead frame 21 is disposed inside the depression 22b of the second lead frame 22.

Referring to FIG. 2(b), the LED package 2 has a housing 23 configured to support the first and second lead frames 21, 22 and having a cavity 231 exposing an LED chip 24. A bonding wire W and portions of the first and second lead frames 21, 22 are exposed through the cavity 231. The cavity 231 may be provided with an encapsulation material (not shown) to encapsulate the LED chip 24.

The first lead frame 21 includes a down-set portion 211 formed by stamping, and the LED chip 24 is mounted in the down-set portion 211. The down-set portion 211 is filled with a light-transmitting resin containing at least one phosphor. As shown in FIG. 2(c), a lower surface of the down-set portion 211 is coplanar with a lower surface of the LED package 2. In FIGS. 2(b)-2(c), the LED package 2 may have low heat dissipation efficiency from the LED chip 24 due to a narrow heat dissipation area, which corresponds to the lower surface of the down-set portion 211.

SUMMARY OF THE INVENTION

Exemplary embodiments of the invention provide an LED package which includes a housing configured to surround uplift portions formed on lead frames electrically connected to an LED chip. The LED package is to increase a heat dissipation area while increasing physical strength between the lead frames and preventing moisture absorption.

Additional features of the invention will be set forth in the description which follows and in part will be apparent from the description, or may be learned by practice of the invention.

An exemplary embodiment of the present invention discloses an LED package including an LED chip, a first lead frame and a second lead frame electrically connected to the LED chip, the first lead frame and the second lead frame respectively including a first uplift portion and a second uplift portion on facing regions thereof, and a housing supporting the first lead frame and the second lead frame, a first side of the housing exposed to the outside. The first lead frame and the second lead frame each include a first side parallel to the first side of the housing and a second side opposite to the first side.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4 is an enlarged cross-sectional view of circle A shown in FIG. 3(b).

DETAILED DESCRIPTION OF THE ILLUSTRATED EMBODIMENTS

Figure 1A:
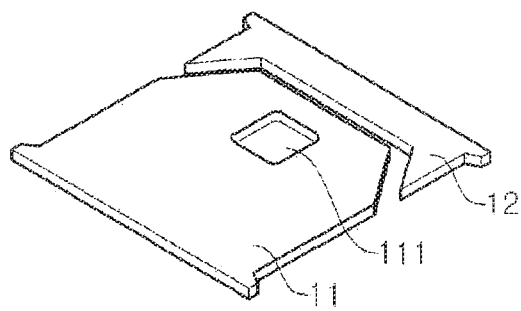
FIGS. 1(a), 1(b), 1(c), 2(a), 2(b), and 2(c) illustrate conventional LED packages.
Figure 1B:
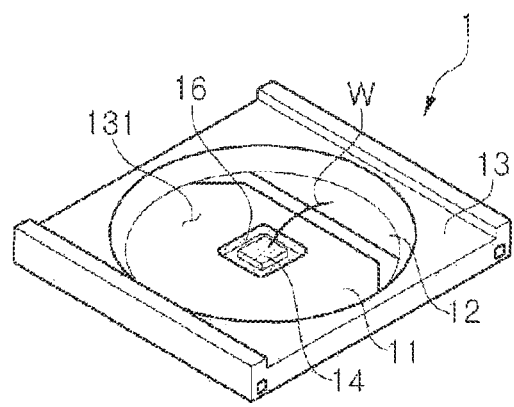
Figure 1C:
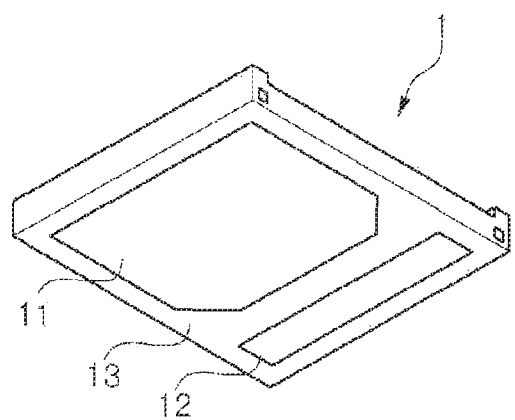
Figure 2A:
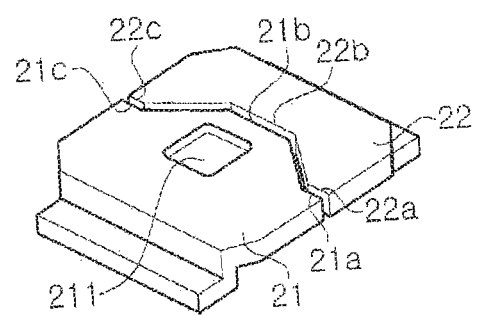
Figure 2B:
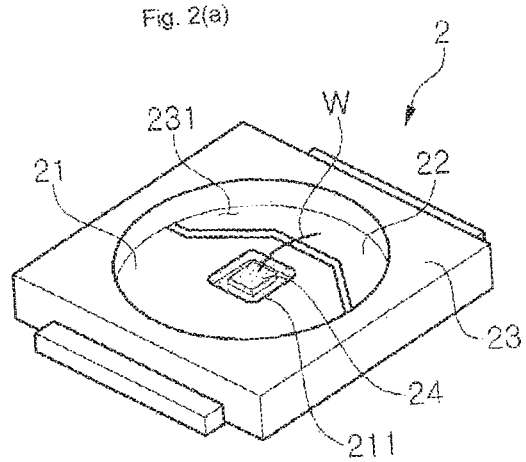
Figure 2C:
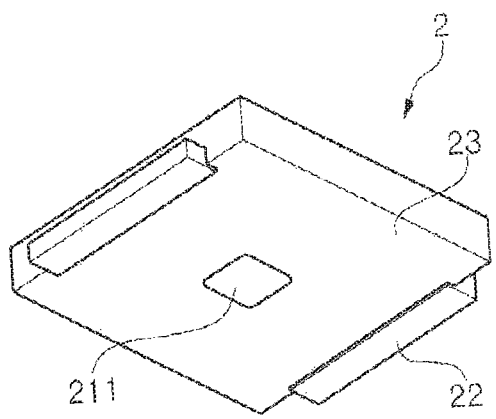

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, no intervening elements are present.

Figure 3A:
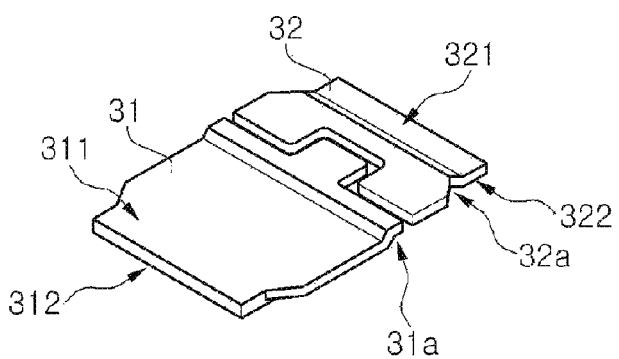
FIGS. 3(a), 3(b), and 3(c) illustrate an LED package according to an exemplary embodiment of the invention.
Figure 3B:
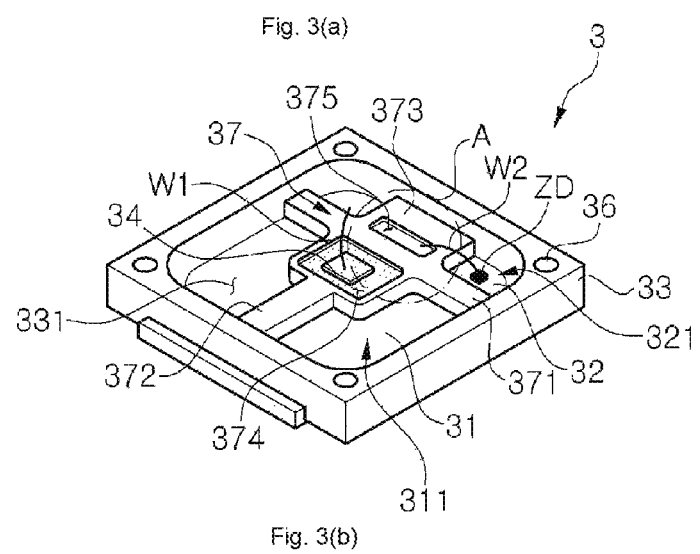
Figure 3C:
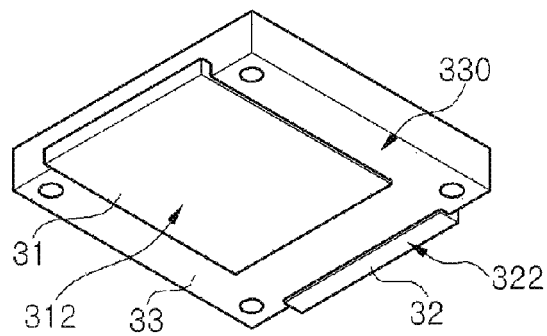

FIGS. 3(a) to 3(c) illustrate an LED package according to an exemplary embodiment of the invention, and FIG. 4 is an enlarged cross-sectional view of circle A shown in FIG. 3(b).

According to the present exemplary embodiment, an LED package 3 includes lead frames 31, 32, as shown in FIG. 3(a).

Referring to FIG. 3(a), the lead frames 31, 32 are separated from each other. The lead frames 31, 32 include uplift portions 31a, 32a respectively formed at adjacent portions thereof. The uplift portions 31a, 32a may be formed by stamping a substantially flat metal plate using, for example, a punch, such that portions of the metal plate respectively corresponding to an anode and a cathode are raised relatively higher than the rest of the lead frames 31 and 32.

Further, the lead frames 31, 32 are disposed to face each other. More specifically, a substantially rectangular tab portion of the uplift portion 31a of the first lead frame 31 is disposed in a corresponding substantially rectangular recessed area in the uplift portion 32a of the second lead frame 32 to lengthen a space formed therebetween, as illustrated in FIG. 3(a).

Referring to FIG. 3(b), the LED package 3 according to the present exemplary embodiment includes a housing which supports the first and second lead frames 31, 32 while surrounding the uplift portions 31a, 32a. The housing may be divided into an external housing 33 and an internal housing 37.

The external housing 33 is open at an upper side thereof and includes a cavity 331 for receiving an LED chip 34.

Further, the external housing 33 may be formed thereon with a mounting hole 36 in consideration of mounting a lens part (not shown). The cavity 331 may be provided therein with an encapsulation material (not shown) which entirely encapsulates the internal housing 37. The encapsulation material may be formed of a light-transmitting resin, for example, silicone resin or epoxy resin.

The internal housing 37 is integrally formed with the external housing 33 by injection molding and has a lower height than the external housing 33. The internal housing 37 and the external housing 33 are configured to expose some of upper surfaces 311, 321 of the first and second lead frames 31, 32. In the present exemplary embodiment, the internal housing 37 is disposed inside the cavity 331 and the external housing 33 is disposed outside the cavity 331, to be connected to the internal housing 37. The external housing 33 and the internal housing 37 may be formed of, for example, PPA or epoxy.

The internal housing 37 includes a reinforcing portion 371, bridges 372, 373, and exposing portions 374, 375, and has a substantially cross shape.

The reinforcing portion 371 fills a space between the first and second lead frames 31, 32, including the lengthened space formed by the substantially rectangular tab and recess portions. In particular, as shown in FIG. 4, the reinforcing portion 371 surrounds the uplift portions 31a, 32a of the first and second lead frames 31, 32, and may be formed higher than the uplift portions 31a, 32a. Since the structure of the reinforcing portion 371 completely surrounds the uplift portions 31a, 32a and the reinforcing portion 371 is formed higher than the uplift portions 31a, 32a, physical strength at a portion dividing the first and second lead frames 31, 32 may be further enhanced and moisture absorption may be prevented.

The bridges 372, 373 extend from the reinforcing portion 371 and are connected to the external housing 33. In the present exemplary embodiment, a first bridge 372 extends from the reinforcing portion 371 to be disposed on a partial region of the first lead frame 31 and is connected to the external housing 33, and a second bridge 373 extends from the reinforcing portion 371 to be disposed on a partial region of the second lead frame 32 and is connected to the external housing 33.

The exposing portions 374, 375 partially expose upper surfaces 311, 321 of the first and second lead frames 31, 32. In the present exemplary embodiment, the first exposing portion 374 exposes a portion of the upper surface 311 of the first lead frame 31 within the first bridge 372 to provide a mounting area for the LED chip 34. The LED chip 34 is mounted on the portion of the upper surface 311 of the first lead frame 31 exposed by the first exposing portion 374. The mounted LED chip 34 is connected to one of exposed portions of the upper surface 321 of the second lead frame 32 via a first bonding wire W1, with the second bridge 373 interposed between the exposed portions of the upper surface 321.

Although the first exposing portion 374 is illustrated as having a rectangle shape with rounded corners in the present exemplary embodiment, the first exposing portion 374 may alternatively have any shape in consideration of the shape and size of the LED chip 34 so long as the LED chip 34 can be mounted at the center of the first exposing portion 374. Further, in addition to the first exposing portion 374, other portions of the upper surface 311 of the first lead frame 31 may be exposed with the first bridge 372 interposed therebetween, and may be used as a mounting area or a bonding area.

The first exposing portion 374 may have an inclined inner wall to reflect light emitted from the LED chip 34. Further, the first exposing portion 374 is provided with an internal encapsulation material (not shown) which covers the LED chip 34 and may be formed of a light-transmitting resin containing at least one phosphor.

The internal housing 37 is formed therein with the second exposing portion 375 through the reinforcing portion 371 and the second bridge 373 to provide a bonding area.

A Zener diode ZD may be mounted on the other exposed portion of the upper surface 321 of the second lead frame 32, with the second bridge 373 interposed between the exposed portions of the upper surface 321, and a second bonding wire W2 for electrically connecting the Zener diode ZD to the first lead frame 31 is bonded to the bonding area provided by the second exposing portion 375. The Zener diode ZD is to protect the LED chip 34 from electrostatic discharge.

The second exposing portion 375 allows the Zener diode ZD to be electrically connected to the first and second lead frames 31, 32 via the second boding wire W2 without crossing the first bonding wire W1.

Referring to FIG. 3(c), a bottom surface 330 of the LED package 3 includes bottom surfaces of the external housing 33 and the internal housing 37, and is parallel with lower surfaces 312, 322 of the first and second lead frames 31, 32 excluding the uplift portions 31a, 32a. The bottom surface 330 of the LED package 3 may be coplanar and flush with lower surfaces 312, 322 of the first and second lead frames 31, 32. Accordingly, heat from the LED chip 34 may be discharged through the lower surfaces 312, 322 of the first and second lead frames 31, 32, thereby improving heat dissipation efficiency from the LED package.

According to the exemplary embodiments of the present invention, the LED package includes a housing configured to surround uplift portions formed on lead frames electrically connected to an LED chip. The LED package is to increase a heat dissipation area while increasing physical strength between the lead frames and preventing moisture absorption. Particularly, a reinforcing portion filling a space between the lead frames may increase physical strength between the lead frames.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiment without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light emitting diode (LED) package, comprising:
    a first lead frame and a second lead frame spaced apart from each other, the first lead frame and the second lead frame respectively comprising a first side and second side facing each other;
    at least one LED chip disposed on the first lead frame;
    a wire electrically connecting the LED chip and the second lead frame; and
    a housing disposed on the first lead frame and the second lead frame;
    wherein the first lead frame comprises a first protrusion in the first side and the second lead frame comprises a corresponding recess in the second side to increase a mechanical bonding strength with a housing,
    wherein at least one portion of the LED chip is disposed within the first protrusion,
    wherein the first protrusion is disposed in the middle of the first side,
    wherein the corresponding recess is disposed in the middle of the second side,
    wherein the second lead frame comprises a pair of second protrusions disposed in the second side at a peripheral of the corresponding recess,
    wherein the first protrusion is substantially rectangular and the corresponding recess is substantially rectangular, and
    wherein the first protrusion, the corresponding recess, and the pair of second protrusions comprise an uplift portion, respectively.

2. The LED package of claim 1,
    wherein the wire is bonded to one of the pair of second protrusions of the second lead frame.

3. The LED package of claim 1, wherein the first protrusion has a width wider than that of the LED chip.

4. The LED package of claim 1, further comprising a zener diode disposed in the second lead frame.

5. The LED package of claim 1, further comprising a zener diode disposed on one of the pair of second protrusions.

6. The LED package of claim 1, wherein each of the first lead frame and the second frame comprises a side portion and a bottom portion exposed from the housing, the bottom portion of the first lead frame having a larger exposed area than the bottom portion of the second lead frame.

7. The LED package of claim 6, wherein the bottom portion is coplanar and flush with a bottom surface of the housing.

8. A light emitting diode (LED) package, comprising:
    a first lead frame and a second lead frame spaced apart from each other by a space, the first lead frame and the second lead frame respectively comprising a first side and a second side facing each other and a first uplift portion and a second uplift portion adjacent the space, the first and second uplift portion comprising portions of the first and second lead frames disposed higher than remaining portions of the first and second lead frames;
    at least one LED chip disposed on the first lead frame in the first uplift portion;
    a housing disposed on the first lead frame and the second lead frame;
    wherein the space comprises a serpentine shape having a plurality of right angles,
    wherein the first lead frame comprises a first rectangular protrusion in the first side forming a lengthened side surface of the first side of the first lead frame to increase a mechanical bonding strength with the housing,
    wherein the first rectangular protrusion is disposed in a middle of the first side in the first uplift portion, and
    wherein the at least one LED chip is further disposed on the first rectangular protrusion.

9. The LED package of claim 8, wherein the second lead frame comprises a corresponding first recess in the second side forming a lengthened side surface of the second side of the second lead frame to increase a mechanical bonding strength with the housing.

10. The LED package of claim 9, wherein the first recess is disposed in a middle of the second side.

11. The LED package of claim 8, wherein the first protrusion is disposed between a pair of second recesses disposed in the first side.

12. The LED package of claim 8, wherein the first protrusion has a width wider than that of the LED chip.

13. The LED package of claim 8, wherein each of the first lead frame and the second frame comprises a side portion and a bottom portion exposed from the housing, the bottom portion of the first lead frame having a lamer exposed area than the bottom portion of the second lead frame.

14. The LED package of claim 13, wherein the bottom portion is coplanar and flush with a bottom surface of the housing.

\* \* \* \* \*